United States Patent [19]

Binsack et al.

[11] 4,446,276

[45] May 1, 1984

[54] AGEING-RESISTANT, PROCESSING-STABLE, HIGH STRENGTH MIXTURES BASED ON THERMOPLASTIC POLYESTERS

[75] Inventors: Rudolf Binsack, Krefeld; Christian Lindner, Cologne; Dieter Rempel; Karl-Heinz Ott, both of Leverkusen, all of Fed. Rep. of Germany

[73] Assignee: Bayer Aktiengesellschaft, Leverkusen, Fed. Rep. of Germany

[21] Appl. No.: 370,788

[22] Filed: Apr. 22, 1982

[30] Foreign Application Priority Data

Apr. 29, 1981 [DE] Fed. Rep. of Germany ....... 3117052

[51] Int. Cl.$^3$ ............................................... C08L 67/02
[52] U.S. Cl. ..................................................... 525/64
[58] Field of Search ................................. 525/64, 243

[56] References Cited

U.S. PATENT DOCUMENTS

| 3,944,631 | 3/1976 | Yu | 525/243 |
|---|---|---|---|
| 4,022,748 | 5/1977 | Schlichting | 525/64 |
| 4,096,202 | 6/1978 | Farnham | 525/64 |
| 4,254,011 | 3/1981 | Bier | 525/64 |
| 4,342,846 | 8/1982 | Silberberg | 525/64 |

*Primary Examiner*—John C. Bleutge
*Assistant Examiner*—Patricia Short
*Attorney, Agent, or Firm*—Connolly and Hutz

[57] ABSTRACT

A graft polymer is obtained from a completely broken latex of an acrylate rubber which is suspended in water and from copolymerisable monomers, in the absence of a suspending agent, which graft polymer may be distributed in thermoplastic polyesters to form particles having a relatively small average diameter.

10 Claims, No Drawings

AGEING-RESISTANT, PROCESSING-STABLE, HIGH STRENGTH MIXTURES BASED ON THERMOPLASTIC POLYESTERS

This invention relates to mixtures of A) thermoplastic polyesters based on aromatic dicarboxylic acids and B) grafted arcylic acid esters which are suitable as moulding compositions, mainly for injection moulding.

Thermoplastic polyesters based on aromatic dicarboxylic acids are widely used as textile raw materials and in the field of moulding compositions owing to the valuable characteristics thereof, such as rigidity, hardness, abrasion resistance and dynamic and thermal carrying capacity. This applies in particular to partly-crystalline thermoplastic polyesters, for example, polyethylene terephthalate, poly-(butanediol-1,4-terephthalate) and poly-(cyclohexane-1,4-bishydroxymethyl-terephthalate). The impact strength of these polyesters does not always meet all requirements, in particular where there is a multiaxial strain.

It is known from German Offenlegungsschrift No. 2,348,377 that the notched impact strength of thermoplastic polyesters may be considerably increased by adding from 3 to 30% by weight of a cross-linked graft polymer. Cross-linked polybutadienes which are grafted with styrene and methyl methacrylate are particularly recommended as graft polymers. The graft polymers should be distributed as homogeneously as possible in the polyester. According to the above-mentioned German Offenlegungsschrift, the particle size of the graft polymers in the polyester moulding is from about 0.02 to 2 µm, preferably from about 0.2 to 1 µm.

It is known that graft polymers having polybutadiene as the graft base age owing to the reactive double bonds, while graft polymers based on polyacrylates do not have this disadvantage. However, if it is attempted to use grafted polyacrylates instead of the grafted polybutadiene in the mixtures according to German Offenlegungsschrift No. 2,348,377, polyester mouldings are obtained which at least partly contain polyacrylates in agglomerated form which mainly have particle sizes of above 3 µm. An agglomeration of this type has an undesirable effect on the mechanical properties of the polyester mouldings, for example, on their strength. Although it is possible to obtain an improved distribution by the effect of high shearing forces, this involves the risk of partial decomposition of the polyester which again results in a deterioration of properties.

Moreover, it is known that rubber which is already homogeneously distributed in a polyester matrix tends to agglomerate during thermoplastic processing. This is more pronounced in the case of polyacrylate rubbers than in the case of polybutadiene rubbers.

Thus, it was not only an object of the present invention to provide mixtures of polyacrylates having a low agglomeration tendency and a good distributing capacity in thermoplastic polyesters. These particles should also withstand longer processing times at an elevated temperature, which may occur, for example, during the compounding operation in an extruder and during injection moulding processing, without agglomerating into particles larger than 3 µm. In the following, this desirable characteristic will be termed in short "processing stability".

Mixtures of thermoplastic polyesters and rubber-elastic graft polymers based on acrylates are known from German Offenlegungsschrift Nos. 2,444,584 and 2,726,256. However, they do not have the required property spectrum and thus do not meet the object of this invention.

Surprisingly, it has now been found that, by the graft polymerisation of monomers, in the absence of suspending agents, on the completely broken latex of an acrylate rubber suspended in water, a pulverulent graft polymer is produced which may be distributed using conventional means in thermoplastic polyesters into an extremely small particle size which even withstands longer processing times at an elevated temperature while remaining relatively unchanged.

The phrase "extremely small particle size" is understood to mean that the quantity, shape and size of the graft polymer particles to be used still substantially corresponds to the quantity, shape and size of the graft polymer particles introduced into the molten thermoplastic polyesters even after homogenisation.

The present invention provides a mixture comprising:
(A) from 55 to 99, preferably from 70 to 98, in particular from 75 to 97% by weight, based on the total of components A and B, of at least one thermoplastic polyester based on aromatic dicarboxylic acids, and
(B) from 1 to 45, preferably from 2 to 30, in particular from 3 to 25% by weight, based on the total of components A and B, of a pulverulent graft polymer comprising
  (a) from 80 to 98, preferably from 85 to 97% by weight, based on B, of an acrylate rubber having a glass transition temperature of below 0° C. as the graft base, and
  (b) from 2 to 20, preferably from 3 to 15% by weight, based on B, of units of at least one polymerisable ethylenically unsaturated monomer, the homo- or co-polymers of which, prepared in the absence of (a), have a glass transition temperature of above 25° C., as graft monomers, characterised in that the graft polymer B is obtainable by grafting monomer (b) onto the completely broken latex of (a) suspended in water in the absence of a suspending agent.

The pulverulent graft polymer B which is produced may then be dried and homogenised with polyester A in the required proportion under the effect of shearing forces, so that the average particle size $d_{50}$ of B in A amounts to from 0.05 to 3, preferably from 0.1 to 2 and in particular from 0.2 to 1 µm.

The term "obtainable" implies graft polymers which are obtained according to this process and graft polymers of an identical constitution which are prepared according to other processes.

Within the context of the present invention, thermoplastic polyesters A are reaction products of aromatic dicarboxylic acids or the reactive derivatives thereof (for example, dimethyl esters or anhydrides) and aliphatic, cycloaliphatic, araliphatic or aromatic diols.

Preferred polyesters A may be prepared according to known methods from terephthalic acid (or from the reactive derivatives thereof) and alkane diols having from 2 to 10 carbon atoms (Kunststoff-Handbuch, Vol. VIII, P 695 ff, Carl Hanser Verlag, Munich 1973).

Preferred polyalkylene terephthalates A contain at least 80, preferably at least 90 mol %, based on the dicarboxylic acid component, of terephthalic acid radicals and at least 80, preferably at least 90 mol %, based on the diol component, of ethylene glycol and/or butane diol-1,4 radicals.

In addition to containing terephthalic acid radicals, the preferred polyalkylene terephthalates A may also contain as much as 20 mol % of radicals of other aromatic dicarboxylic acids having from 8 to 14 carbon atoms, or aliphatic dicarboxylic acids having from 4 to 12 carbon atoms, for example, radicals of phthalic acid, isophthalic acid, naphthalene-2,6-dicarboxylic acid, diphenyl-4,4'-dicarboxylic acid, succinic acid, adipic acid, sebacic acid, azelaic acid and cyclohexanediacetic acid.

In addition to containing ethylene glycol or butane diol-1,4 radicals, the preferred polyalkylene terephthalates A may also contain as much as 20 mol % of other aliphatic diols having from 3 to 12 carbon atoms, or cycloaliphatic diols having from 6 to 21 carbon atoms, for example, radicals of the following: propane diol-1,3, 2-ethylpropane diol-1,3, neopentyl glycol, pentane diol-1,5, hexane diol-1,6, cyclohexane-dimethanol-1,4, 3-methylpentane diol-2,4, 2-methyl-pentane diol-2,4, 2,2,4-trimethylpentane diol-1,3 and -1,6, 2-ethylhexane diol-1,3, 2,2-diethylpropane diol-1,3, hexane diol-2,5, 1,4-di-($\beta$-hydroxyethoxy)-benzene, 2,2-bis-(4-hydroxycyclohexyl)-propane, 2,4-dihydroxy-1,1,3,3-tetramethyl-cyclobutane, 2,2-bis-(3-$\beta$-hydroxy-ethoxyphenyl)-propane and 2,2-bis-(4-hydroxypropoxyphenyl)-propane (German Offenlegungsschrift Nos. 2,407,674; 2,407,776; and 2,715,932).

The polyalkylene terephthalates A may be branched by the incorporation of relatively small quantities of trihydric or tetrahydric alcohols or tri- or tetra-basic carboxylic acids, as described, for example, in German Offenlegungsschrift No. 1,900,270 and in U.S. Pat. No. 3,692,744. Examples of preferred branching agents are trimesic acid, trimellitic acid, trimethylolethane and trimethylolpropane and pentaerythritol. It is advisable not to use more than 1 mol % of the branching agent, based on the acid component.

Particularly preferred polyalkylene terephthalates A are those which are prepared alone from terephthalic acid or from the reactive derivatives thereof (for example, the dialkyl esters thereof) and ethylene glycol or butane diol-1,4.

The polyethylene terephthalates which are preferably used as component A usually have an intrinsic viscosity of from 0.4 to 1.5 dl/g, preferably from 0.5 to 1.3 dl/g and in particular from 0.6 to 1.2 dl/g and the polybutylene terephthalates used as component A usually have an intrinsic viscosity of from 0.7 to 1.5 dl/g, preferably from 0.8 to 1.3 dl/g and in particular from 0.8 to 1.05 dl/g, in each case measured in phenol/o-dichlorobenzene. (1:1 parts by weight) at 25° C.

The acrylate rubbers B (a) are preferably polymers of acrylic acid alkyl esters, optionally with up to 40% by weight of other polymerisable ethylenically unsaturated monomers. If the acrylate rubbers used as the graft base (a), as described below, are themselves already graft products having a diene rubber core, this core is not included in the calculation of this percentage. The following are included among the preferred polymerisable acrylates: $C_1-C_8$-alkyl esters, for example, methyl, ethyl, butyl, octyl and 2-ethylhexyl esters; halogenalkyl esters, preferably halogen-$C_1-C_8$-alkyl esters, such as chloroethyl acrylate, and aromatic esters such as benzyl acrylate and phenethyl acrylate. They may be used individually or in admixture.

The acrylate rubbers (a) may be non-cross-linked or cross-linked, but are preferably partly cross-linked.

For the cross-linking operation, monomers having more than one polymerisable double bond may be copolymerised. Preferred examples of cross-linking monomers are esters of unsaturated monocarboxylic acids having from 3 to 8 carbon atoms and unsaturated monohydric alcohols having from 3 to 12 carbon atoms or saturated polyols having from 2 to 4 OH-groups and from 2 to 20 carbon atoms, for example, ethylene glycol dimethacrylate and allyl methacrylate; polyunsaturated heterocyclic compounds, for example, trivinyl and triallyl cyanurate and isocyanurate, tris-acryloyl-s-triazines, in particular triallyl cyanurate; polyfunctional vinyl compounds such as di- and trivinylbenzenes; but also triallyl phosphate and diallyl phthalate.

Preferred cross-linking monomers include allyl methacrylate, ethylene glycol dimethacrylate, diallyl phthalate and heterocyclic compounds which contain at least three ethylenically unsaturated groups.

Particularly preferred cross-linking monomers are the cyclic monomers triallyl cyanurate, triallyl isocyanurate, trivinylcyanurate, triacryloylhexahydro-s-triazine and triallyl benzenes.

The quantity of the cross-linking monomers is preferably from 0.02 to 5, in particular from 0.05 to 2% by weight, based on the graft base (a).

In the case of cyclic cross-linking monomers having at least three ethylenically unsaturated groups, it is advantageous to restrict the quantity of less than 1% by weight of the graft base (a).

"Other" preferred polymerisable ethylenically unsaturated monomers which, in addition to the acrylates, may optionally be used for the preparation of the graft base (a), include, for example, acrylonitrile, styrene, $\mu$-methyl-styrene, acrylamide and vinyl-$C_1-C_6$ alkyl ethers. Preferred acrylate rubbers useful as the graft base (a) are emulsion polymers which contain $\geq 60\%$ by weight of gel.

The gel content of the graft base (a) is determined at 25° C. in dimethylformamide (M. Hoffmann, H. Krömer, R. Kuhn, Polymeranalytik I and II, Georg Thieme Verlag, Stuttgart 1977).

Acrylate rubbers which may also be used as the graft base (a) are those which are produced as an aqueous emulsion (latex) and the latex particles of which contain from 1 to 20% by weight, preferably from 1 to 10% by weight, based on (a), of monomers which are already grafted in an aqueous emulsion, the homo- or copolymers of which would have glass transition temperatures of above 0° C.

Preferred grafted monomers of this type include the following: alkyl acrylates, alkyl methacrylates, styrene, acrylonitrile, α-methylstyrene and/or vinyl acetate.

Graft bases (a) of this type are prepared, for example, by emulsion polymerisation or emulsion graft polymerisation. However, they may also be prepared by first preparing an acrylate rubber in solution or in bulk, then grafting on the graft monomers and subsequently transferring these rubbers into an aqueous emulsion which is suitable for further graft processes.

Acrylate rubbers as the graft base (a) may also be products which contain as a core a cross-linked diene rubber from one or more conjugated dienes, such as polybutadiene, or a copolymer of a conjugated diene with an ethylenically unsaturated monomer, such as styrene and/or acrylonitrile.

The quantity of the polydiene core in the graft base (a) may be from 0.1 to 80, preferably from 10 to 50% by weight, based on (a). The shell and the core may be non-cross-linked, partly cross-linked or highly cross-linked, independently of each other.

Thus, preferred graft bases (a) may be selected from the following groups:

1. polyacrylate polymers and copolymers,
2. polyacrylate polymers and copolymers which contain a diene rubber core, and
3. graft polymers prepared in an aqueous emulsion from polyacrylate polymers or copolymers which optionally contain a diene rubber core, and from ethylenically unsaturated polymerisable monomers.

The graft yield, i.e., the quotient of the quantity of the grafted-on monomers (b) and the quantity of the graft monomer (b) which is used is usually from 20 to 80% by weight. It may be determined as described by M. Hoffmann, H. Krömer and R. Kuhn in Polymeranalytik, Volume I, Georg Thieme Verlag, Stuttgart 1977.

Preferred graft monomers (b) are α-methylstyrene, styrene, acrylonitrile, methyl methacrylate or mixtures of these monomers. Preferred graft monomer mixtures are those of styrene and acrylonitrile in a weight ratio of from 90:10 to 50:50.

The pulverulent graft polymers B may be prepared as follows: First of all, the monomers of the graft base (a) are polymerised in a known manner in the presence of radical-forming initiators in emulsion, so that particles having an average particle diameter $d_{50}$ of from 0.05 to 3 mm are produced. The monomer mixture may be introduced into the polymerisation system at the start of or during the course of polymerisation, continuously or partly continuously.

If a cross-linked acrylate rubber having a cross-linked diene rubber as the core is used as the graft base (a), the diene rubber is initially prepared by emulsion polymerisation of a conjugated diene in latex form. The graft monomers are then likewise emulsified in aqueous emulsion in the diene rubber latex and polymerised in a known manner in the presence of radical-forming initiators. The acrylate rubber shell which results thus may already be cross-linked during preparation by simultaneously using cross-linking monomers.

During this process for the preparation of a graft base (a) which is already partly grafted in emulsion, the formation of new particles must be prevented as completely as possible. An emulsion stabiliser must be present in a quantity which is required for the surface covering of the particles. The size of these particles may be varied within wide limits by the method according to which the reaction is carried out. If an agglomerated latex is used as the polydiene core in order to obtain large particles, the acrylate rubber particles may contain several diene rubber cores. It is also possible to carry out the polymerisation process of the acrylate rubber such that acrylate rubber particles with and without diene rubber cores are produced at the same time. Mixtures of this type may also be used as the graft base (a) in special circumstances.

If a rubber which is already grafted is used as the graft base (a), then an aqueous suspension of this grafted rubber must initially be prepared.

Subsequently to the preparation of the graft base (a), this emulsion is completely broken or coagulated, for example, by electrolytes, acids, bases, by mechanical effects or by temperature. The process is preferably carried out using aqueous solutions of acids and/or salts at elevated temperatures, in particular at temperatures, of from 30° to 100° C. As a result of this, a heterogeneous suspension of the polymer in the form of discrete polymer particles of the most varied shape and size is obtained in the aqueous phase. The characteristics of the particles may be influenced in the coagulation medium by varying the precipitation parameters.

The process is favourably influenced by stirring these suspensions.

After the polymer suspension is produced in the aqueous coagulation medium, the graft monomers (b), optionally combined with regulators, radical initiators (in particular water-soluble persulphates) or antioxidants are then introduced into the moving polymer suspension and are polymerised radically, preferably at a temperature in the range of from about 30° to 100° C. The addition of suspending agents is to be avoided during this operation.

The graft polymer B is then isolated, for example by filtration or centrifugation, and is then dried. The process is suitable for a discontinuous, semi-continuous or a fully-continuous method.

After being isolated and dried, the graft polymers B are storage-stable, free-flowing, non-tacky powders which may be easily metered using conventional powder conveying aggregates for mixing with the thermoplastic polyesters A. A particular advantage is the dispersibility of the graft products B in the molten polyester A, which is outstanding without a considerable shearing force.

If the graft polymers B, which are to be used according to the present invention, contain quantities of polymer which results from the polymerisation of ungrafted portions of the graft monomers (b), the term "graft polymer B" should be understood to mean the total of the reaction products which are produced by polymerisation of the graft monomers (b) in the presence of the graft base (a), independently of the degree of grafting.

The pulverulent graft polymer B has an average powder particle size, determined by sieve analysis, of from 0.01 to 10, preferably from 0.05 to 8 and in particular from 0.1 to 4 mm.

The average particle size $d_{50}$ is the diameter above and below which lie respectively 50% by weight of the particles. It may be determined by ultra-centrifugal measurements (W. Scholtan, H. Lange, Kolloid. Z. and Z. Polymere 250 (1972), (782–796), or by electron microscopy and subsequently counting out the particles (G. Käpf, H. Schuster, Angew. Makromolekulare Chemie 14, (1970), 111–129 or by light-scattering measurements.

The phrase "in the absence of a suspending agent" which is used in the characterising clause of claim 1 means the absence of materials which, depending on type and quantity, could suspend the graft monomers (b) in the aqueous phase. This definition does not exclude the presence of materials which had a suspending effect, for example, during the preparation of a grafted graft base (a). In such cases, the coagulation agent or precipitant which is used for breaking the latex (a) must be added in a quantity which compensates the suspending effect of the materials used in the preliminary stage. In other words, care must be taken according to this invention that the graft monomers (b) do not produce a (stable) emulsion in the aqueous phase.

The polyester moulding compositions according to the present invention may contain conventional additives, such as lubricants and mould-release agents, nucleation agents, stabilisers, fillers and reinforcing materials, flameproofing agents and dyes.

The filled or reinforced moulding compositions may contain up to 60, preferably from 10 to 50% by weight, based on the moulding composition, of a filler and/or a reinforcing material. Glass fibres are preferred reinforcing materials. Preferred fillers which may also have a reinforcing effect are glass beads, mica, silicates, quartz, talcum, titanium dioxide and wollastonite.

Those polyester moulding compositions provided with flameproofing agents contain such flameproofing agents in a concentration of generally less than 30% by weight, based on the moulding composition.

All known flameproofing agents are included, for example, polyhalogendiphenyl, polyhalogendiphenylether, polyhalogenphthalic acid and the derivatives thereof and polyhalogenpolycarbonates, the corresponding bromine compounds being particularly effective. Moreover, the moulding compositions usually contain a synergist, for example, antimony trioxide.

The moulding compositions may be prepared in the conventional mixing arrangements such as rollers, kneaders and uni- and multi-shaft extruders. Double-shaft extruders and kneaders are particularly suitable.

The moulding compositions may be prepared in the mixing apparatus mentioned by melting down together and homogenising the two components A and B or by working the graft polymer B into the melt of the polyester A.

The temperature during the preparation of the mixtures should be at least 10° C. and appropriately at the most 80° C. above the melting point of the polyester A.

According to one advantageous process, a mixture containing less than the required quantity of polyester A is prepared in a first step in one of the mixing arrangements mentioned and is processed with more polyester A into the mixtures according to the present invention in a second step.

The mixtures according to the present invention are distinguished, with low contents of graft polymer B, by a considerable improvement in the impact strength under multi-axial stress, even when using polyesters which have a relatively low molecular weight. It is also surprising that the mixtures have a high weld line strength. They are also distinguished by a high dimensional stability to heat and by a surprisingly high resistance to ageing in hot air.

Thus, in accordance with the property spectrum, the mixtures according to the present invention may be widely used in the injection moulding and extrusion sector, where a high multi-axial strength combined with a high dimensional stability to heat and hot-air resistance are required, for example, for operating parts in engine compartments of motor vehicles and for household appliances subject to thermal stress.

Parts specified in the following Examples are parts by weight and percentages are based on weight.

EXAMPLES

1. Preparation of the graft base (a)

1.1 Preparation of a polybutadiene latex

An emulsion of the following composition is polymerised with stirring in a reactor at 65° C. within about 22 hours until practically all the monomers have been reacted.
100 parts of butadiene,
1.8 parts of Na-salt of disproportionated abietic acid,
0.257 parts of sodium hydroxide,
0.3 parts of n-dodecylmercaptan,
1.029 parts of Na-ethylenediaminetetraacetate,
0.023 parts of potassium persulphate, and
176 parts of water.

A latex is obtained which contains polybutadiene particles having an average diameter ($d_{50}$) of 0.1 $\mu$m in a concentration of about 36%.

1.2 Preparation of an acrylate rubber which contains polydiene cores

The following mixture is introduced into a reactor with stirring at 63° C.:
200 parts of latex 1.1,
5000 parts of water,
14 parts of potassium persulphate,
0.9124 parts of triallyl cyanurate, and
399.09 parts of n-butyl acrylate.

The following mixtures are metered separately into the reactor at 63° C. within a period of 5 hours:
Mixture 1: 90 parts of $C_{14}$–$C_{18}$-alkyl-sulphonate-Na, and 11900 parts of water.
Mixture 2: 23.09 parts of triallyl cyanurate, and 10101 parts of n-butyl acrylate.

The mixtures are then left for 2 hours at 65° C. to polymerise completely. The resulting polymers have gel contents of from 85 to 95%, by weight, and average particle diameters ($d_{50}$) of 0.5 $\mu$m (polymer content in the latex: 38%).

2. Preparation of the graft polymers B 2.1 Graft polymer of 90% of acrylate rubber 1.2 and 10% of methyl methacrylate.

The following are introduced into a reactor at 70° C.:
18800 parts of water, and
245 parts of magnesium sulphate ($MgSO_4 \cdot xH_2O$).
11200 parts of latex 1.2 are then run into the reactor with stirring over a period of 2 hours.

After the latex has been introduced, 1 part of potassium persulphate is introduced into the reactor and 480 parts of methyl methacrylate are then metered in evenly with stirring over a period of 1 hour. The suspension is then stirred for 1 hour at 90° C. The polymer may then be isolated (graft polymer K).

2.2 Graft polymer of 90% of acrylate rubber 1.2, 7.2% of styrene and 2.8% of acrylonitrile.

Example 2.1 is repeated, but a mixture of 134 parts of acrylonitrile and 346 parts of styrene is metered into the rubber suspension instead of methyl methacrylate (graft polymer L).

3. Preparation of the graft polymers B which contain radicals of monomers (b) which are grafted in emulsion and in suspension.

3.1 Preparation of the emulsion graft polymers 3.1.1. Emulsion graft polymer of 90% of acrylate rubber 1.2 and 10% methyl methacrylate.

The following are introduced into a reactor:
3296 parts of latex 1.2,
1.5 parts of potassium persulphate, and
90 parts of water.

The following mixtures are metered separately into the reactor at 65° C.:
Mixture 1: 139 parts of methyl methacrylate,
Mixture 2: 150 parts of water, and 4 parts of $C_{14}$–$C_{18}$-alkylsulphonate-Na.

The mixtures are then left for 4 hours at 65° C. to polymerise completely (graft polymer M) (polymer content in the latex: 37.8%).

3.1.2. Emulsion graft polymer of 90% of acrylate rubber 1.2, 7.2% of styrene and 2.8% of acrylonitrile.

Example 3.1.1. is repeated, but a mixture of 39 parts of acrylonitrile and 100 parts of styrene is metered in as mixture 1 instead of methyl methacrylate (graft polymer N).

3.2 Preparation of the graft polymers B from the emulsion graft polymers 3.2.1 Graft polymer of 80% of acrylate rubber and 20% of methyl methacrylate.

The following are introduced into a reactor at 70° C.:
18800 parts of water, and
240 parts of magnesium sulphate.
11200 parts of latex 3.1.1 (graft polymer M) are then run into the reactor with stirring over a period of 2 hours.
After the latex has been introduced, 1 part of potassium persulphate is added into the reactor.
529 parts of methyl methacrylate are then metered in evenly with stirring over a period of 1 hour. The suspension is then stirred for 1 hour at 90° C. The polymer is then isolated (graft polymer O).

3.2.2. Graft polymer of 80% of acrylate rubber, 14.4% of styrene and 5.6% of acrylonitrile.

Example 3.2.1 is repeated. The latex 3.1.2 is used with the graft polymer N instead of latex 3.1.1 and the process is carried out using a mixture of the following instead of methyl methacrylate:
148 parts of acrylonitrile, and
381 parts of styrene.
(graft polymer P).

4. Preparation of comparative graft polymers

Graft polymer, type Q

Copolymer of n-butyl acrylate and the acrylic acid ester of tricyclodecenyl alcohol having graft branches of 75% of styrene and 25% of acrylonitrile (according to German Offenlegungsschrift No. 2,444,584).

Graft polymer, type R

Copolymer comprising a graft base of
69.45 parts of n-butyl acrylate,
0.35 parts of 1,3-butylene diacrylate, and
0.28 parts of allyl methacrylate,
and a graft shell of
19.95 parts of methyl methacrylate, and
9.97 parts of allyl methacrylate (according to German Offenlegungsschrift No. 2,726,256).

5. Preparation of the mixtures

The following polyesters were melted down on a continuously operating double-shaft machine produced by Werner & Pfleiderer:
Type S: Poly(butane diol-1,4-terephthalate) having an intrinsic viscosity of 0.95 dl/g[1)]
Type T: poly(butane diol-1,4-terephthalate) having an intrinsic viscosity of 1.15 dl/g[1)]
Type U: polyethylene terephthalate having an intrinsic viscosity of 0.80 dl/g[1)].

The graft polymer B is metered into the polyester melt under a nitrogen atmosphere through a second inlet tube and is homogeneously dispersed in the melt. (It may be advantageous to degas the melt before it issues from the nozzle.) The cylinder temperatures were selected such that a mass temperature of 255° C. was ensured for poly (butane diol-1,4-terephthalate) and a mass temperature of 275° C. was ensured for polyethylene terephthalate. The melt strand of the mixtures according to the present invention was cooled in water, granulated and dried. Small standard rods (according to DIN 53 453) and plates having dimensions of 3×60×60 mm were injection-moulded from the granulated material on a conventional injection moulding machine at the following moulding temperatures. Poly(butane diol-1,4-terephthalate) mixture: 80° C., polyethylene terephthalate mixture: 140° C.

(1) Measured in an Ubbelohde viscosimeter in phenol/-o-di-chlorobenzene (weight ratio of 1:1) at 25° C.

The following properties were tested: the impact strength and notched impact strength (according to DIN 53 453), the ball indentation hardness (according to DIN 53 456), the dimensional stability to heat according to Vicat (in accordance with DIN 53 460) and the impact strength under multi-axial stress in the EKWA test (according to DIN 53 443, sheet 2), penetration of a plate having dimensions of 3×60×60 mm by a weight of 35 kg, using a penetration pin with spherical tip, diameter 20 mm, falling from a height of 1 m). The weld line strength was tested in the tensile test (according to DIN 53 455) on tension test bars joined by injection at both ends. The results are given in the Table.

TABLE

| | Composition | | | | | | | EKWA[3)]-Test | |
|---|---|---|---|---|---|---|---|---|---|
| | Polyester | | Graft Polymer | | $a_k$[1)] | $H_c$[2)] | Vicat B | | Number of tough |
| | type | % | Type | % | kJ/m² | MPa | °C. | W. sec | breaks % |
| Examples | | | | | | | | | |
| 1 | S | 95 | O | 5 | 3.5 | 113 | 178 | 90 | 100 |
| 2 | S | 90 | O | 10 | 5.5 | 102 | 164 | 111 | 100 |
| 3 | S | 97 | P | 3 | 4.2 | 116 | 175 | 98 | 95 |
| 4 | S | 95 | P | 5 | 5.0 | 109 | 169 | 113 | 100 |
| 5 | S | 90 | P | 10 | 7.5 | 100 | 162 | 110 | 100 |
| 6 | S | 95 | K | 5 | 3.8 | 112 | 177 | 110 | 100 |
| 7 | S | 95 | L | 5 | 5.5 | 108 | 168 | 111 | 100 |
| 8 | T | 90 | L | 10 | 8.8 | 98 | 161 | 108 | 100 |
| 9 | T | 80 | P | 20 | 32 | 78 | 132 | 92 | 100 |
| 10 | T | 70 | P | 30 | u.b.[4)] | 58 | 105 | 78 | 100 |
| 11 | T | 60 | P | 40 | u.b.[4)] | 43 | 72 | 75 | 100 |
| 12 | U | 95 | P | 5 | 3.8 | 127 | 172 | 108 | 100 |
| 13 | U | 90 | P | 10 | 6.8 | 120 | 168 | 107 | 100 |
| Comparative Examples | | | | | | | | | |

TABLE-continued

| | Composition | | | | $a_k$[1] | $H_c$[2] | Vicat B | EKWA[3]-Test | |
|---|---|---|---|---|---|---|---|---|---|
| | Polyester | | Graft Polymer | | | | | | Number of tough |
| | type | % | Type | % | kJ/m² | MPa | °C. | W. sec | breaks % |
| 14 | S | 100 | — | — | 2.3 | 123 | 182 | 15 | 0 |
| 15 | S | 95 | Q | 5 | 2.5 | 108 | 171 | 32 | 20 |
| 16 | S | 95 | R | 5 | 2.6 | 109 | 172 | 37 | 30 |

The result of the impact strength test on the samples of all the Examples was "unbroken".
The weld line strength[5] for all the samples was 100%.
[1] Notched impact strength
[2] Ball indentation hardness
[3] EKWA: Elektronische Kraft/Weg-Aufnahme (Electronic force/distance recording)
[4] "unbroken"
[5] $\frac{\text{Tensile strength with weld line} \cdot 100}{\text{Tensile strength without weld line}}$

We claim:

1. A mixture comprising:
    (A) from 55 to 99% by weight, based on the total of components A and B, of at least one thermoplastic polyester based on aromatic dicarboxylic acids, and
    (B) from 1 to 45% by weight, based on the total of components A and B, of a pulverulent graft polymer having an average particle size of 0.01 to 10 mm and comprising
        (a) from 80 to 98% by weight, based on B, of an acrylate rubber having a glass transition temperature of below 0° C. as the graft base, and
        (b) from 2 to 20% by weight, based on B, of units of at least one polymerisable ethylenically unsaturated monomer which does not form a stable emulsion, the homo- or copolymers of which, produced in the absence of (a), have a glass transition temperature of above 25° C., as graft monomers,
    characterised in that the graft polymer B is obtainable by grafting monomer (b) on the completely broken latex of (a) suspended in water, in the absence of a suspending agent.

2. A mixture according to claim 1, characterised in that the mixture consists of from 70 to 98% by weight of component A and from 2 to 30% by weight of component B, in each case based on the total of components A and B.

3. A mixture according to claim 1, characterised in that the mixture consists of from 75 to 97% by weight of component A and from 3 to 25% by weight of component B, in each case based on the total of components A and B.

4. A mixture according to claim 1, characterised in that the pulverulent graft polymer is obtainable from 85 to 97% by weight of graft base (a) and from 3 to 15% by weight of graft monomer (b), in each case based on B.

5. A mixture according to claim 1, characterised in that the average particle size $d_{50}$ of B in A is from 0.1 to 2 μm.

6. A mixture according to claim 1, characterised in that the average particle size $d_{50}$ of B in A is from 0.2 to 1 μm.

7. A mixture according to claim 1, characterised in that the polyester A is selected from the group of polyethylene terephthalate and polybutylene terephthalate.

8. A mixture according to claim 1, characterised in that the graft base (a) contains a diene rubber core.

9. A mixture according to claim 1, characterised in that the graft base (a) is an emulsion graft polymer.

10. A mixture according to claim 1, characterised in that it is reinforced with glass fibres.

* * * * *